(12) United States Patent
Scott et al.

(10) Patent No.: US 11,196,392 B2
(45) Date of Patent: Dec. 7, 2021

(54) DEVICE AND DEVICE PROTECTION SYSTEM (71) Applicant: Qorvo US, Inc., Greensboro, NC (US)

(72) Inventors: Baker Scott, San Jose, CA (US);
George Maxim, Saratoga, CA (US);
Chong Woo, Fremont, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/834,049

(22) Filed: Mar. 30, 2020

(65) Prior Publication Data
US 2021/0305944 A1 Sep. 30, 2021

(51) Int. Cl.
*H03F 1/30* (2006.01)

(52) U.S. Cl.
CPC ....... *H03F 1/302* (2013.01); *H03F 2200/447* (2013.01); *H03F 2200/451* (2013.01); *H03F 2200/468* (2013.01); *H03F 2200/477* (2013.01); *H03F 2200/555* (2013.01)

(58) Field of Classification Search
CPC ........................................................ H03F 1/30
USPC ................................................. 330/289, 298
See application file for complete search history.

(56) References Cited

U.S. PATENT DOCUMENTS

| | | | |
|---|---|---|---|
| 5,510,753 A * | 4/1996 | French | H03F 1/0227 330/10 |
| 5,838,732 A | 11/1998 | Carney | |
| 6,107,862 A | 8/2000 | Mukainakano et al. | |
| 6,141,377 A | 10/2000 | Sharper et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 7,994,862 B1 * | 8/2011 | Pukhovski | H03F 3/211 330/289 |
| 8,461,928 B2 | 6/2013 | Yahav et al. | |
| 8,493,141 B2 | 7/2013 | Khlat et al. | |
| 8,519,788 B2 | 8/2013 | Khlat | |
| 8,588,713 B2 | 11/2013 | Khlat | |
| 8,718,188 B2 | 5/2014 | Balteanu et al. | |
| 8,725,218 B2 | 5/2014 | Brown et al. | |
| 8,774,065 B2 | 7/2014 | Khlat et al. | |
| 8,803,603 B2 | 8/2014 | Wimpenny | |

(Continued)

FOREIGN PATENT DOCUMENTS

EP 3174199 A2 5/2017

OTHER PUBLICATIONS

Non-Final Office Action for U.S. Appl. No. 14/836,634, dated May 16, 2016, 9 pages.
(Continued)

*Primary Examiner* — Henry Choe
(74) *Attorney, Agent, or Firm* — Withrow & Terranova, PLLC (57) ABSTRACT

A device having device function circuitry configured to receive a device signal and output a modified device signal is disclosed. The device includes a device temperature sensor configured to generate a device temperature signal that is proportional to a temperature of the device function circuitry. The device function circuitry is further configured to maintain power dissipation of the device function circuitry to below a predetermined safe power dissipation level in response to a control signal that is generated based upon the device temperature signal.

20 Claims, 5 Drawing Sheets

(56) References Cited

U.S. PATENT DOCUMENTS

| | | |
|---|---|---|
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,018,921 B2 * | 4/2015 | Gurlahosur ......... H02J 7/00718 320/164 |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 11,128,261 B2 | 9/2021 | Ranta et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat |
| 2019/0238095 A1 | 8/2019 | Khlat |
| 2019/0267956 A1 | 8/2019 | Granger-Jones et al. |
| 2019/0222175 A1 | 10/2019 | Khlat |
| 2020/0007090 A1 | 1/2020 | Khlat |
| 2020/0036337 A1 | 1/2020 | Khlat |
| 2020/0106392 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |

(56) References Cited

U.S. PATENT DOCUMENTS

2020/0259456 A1  8/2020  Khlat
2020/0259685 A1  8/2020  Khlat
2020/0266766 A1  8/2020  Khlat et al.

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 151902,244, dated Feb. 8, 2019, 8 pages.
Advisory Action for U.S. Appl. No. 151888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 151986,948, dated Nov. 8, 2019, 3 pages.
Notice of Allowance for U.S. Appl. No. 151986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 161354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Final Office Action for U.S. Appl. No. 16/122,611, dated Sep. 18, 2020, 17 pages.
Notice of Allowance for U.S. Appl. No. 16/246,859, dated Sep. 18, 2020, 8 pages.
Quayle Action for U.S. Appl. No. 16/421,905, dated Aug. 25, 2020, 5 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
Notice of Allowance for U.S. Appl. No. 16/122,611, dated Apr. 1, 2021, 8 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.
Notice of Allowance for U.S. Appl. No. 16/582,471, dated Jun. 22, 2021, 9 pages.
Non-Final Office Action for U.S. Appl. No. 17/126,561, dated Oct. 14, 2021, 6 pages.

* cited by examiner

DEVICE AND DEVICE PROTECTION SYSTEM

FIELD OF THE DISCLOSURE

The present disclosure relates to protection circuitry for electronic devices that are susceptible to thermal runaway.

BACKGROUND

Electronic devices such as bipolar power amplifiers use base ballast resistors and/or emitter ballast resistors to achieve thermal stability. However, in wide bandwidth applications a relatively large ballast resistor in conjunction with a relatively large input capacitance of an output power amplifier stage creates a pole that may be lower than a maximum modulation bandwidth, which can be 200 MHz and higher. A lower pole due to the relatively large input capacitance precludes fast dynamic biasing control needed to prevent thermal runaway of bipolar power amplifiers. Moreover, other electronic devices such as thyristors used to control utility power and electric vehicles also need to be protected from thermal damage. As such, there is a need for electronic devices and device protection systems that are structured for fast dynamic biasing and/or shutdown control of electronic devices in thermal distress.

SUMMARY

A device having device function circuitry configured to receive a device signal and output a modified device signal is disclosed. The device includes a device temperature sensor configured to generate a device temperature signal that is proportional to a temperature of the device function circuitry. Device function circuitry is further configured to maintain power dissipation of the device function circuitry to below a predetermined safe power dissipation level in response to a control signal that is generated based upon the device temperature signal.

Another exemplary embodiment discloses a device protection system that includes device protection circuitry. The device protection circuitry has a reference temperature sensor configured to generate a reference temperature signal that is different in magnitude from the device temperature signal as the power dissipation of device function circuitry exceeds the predetermined safe power dissipation level. The device protection circuitry further includes a difference amplifier that is configured to amplify a difference between the device temperature signal and reference temperature signal to generate an error signal. Further included is a device controller configured to generate the control signal received by the device function circuitry.

The device controller generates the control signal in response to the error signal. The control signal is configured by the device controller to lower or eliminate power dissipation of the device function circuitry in order to protect the device from thermal damage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
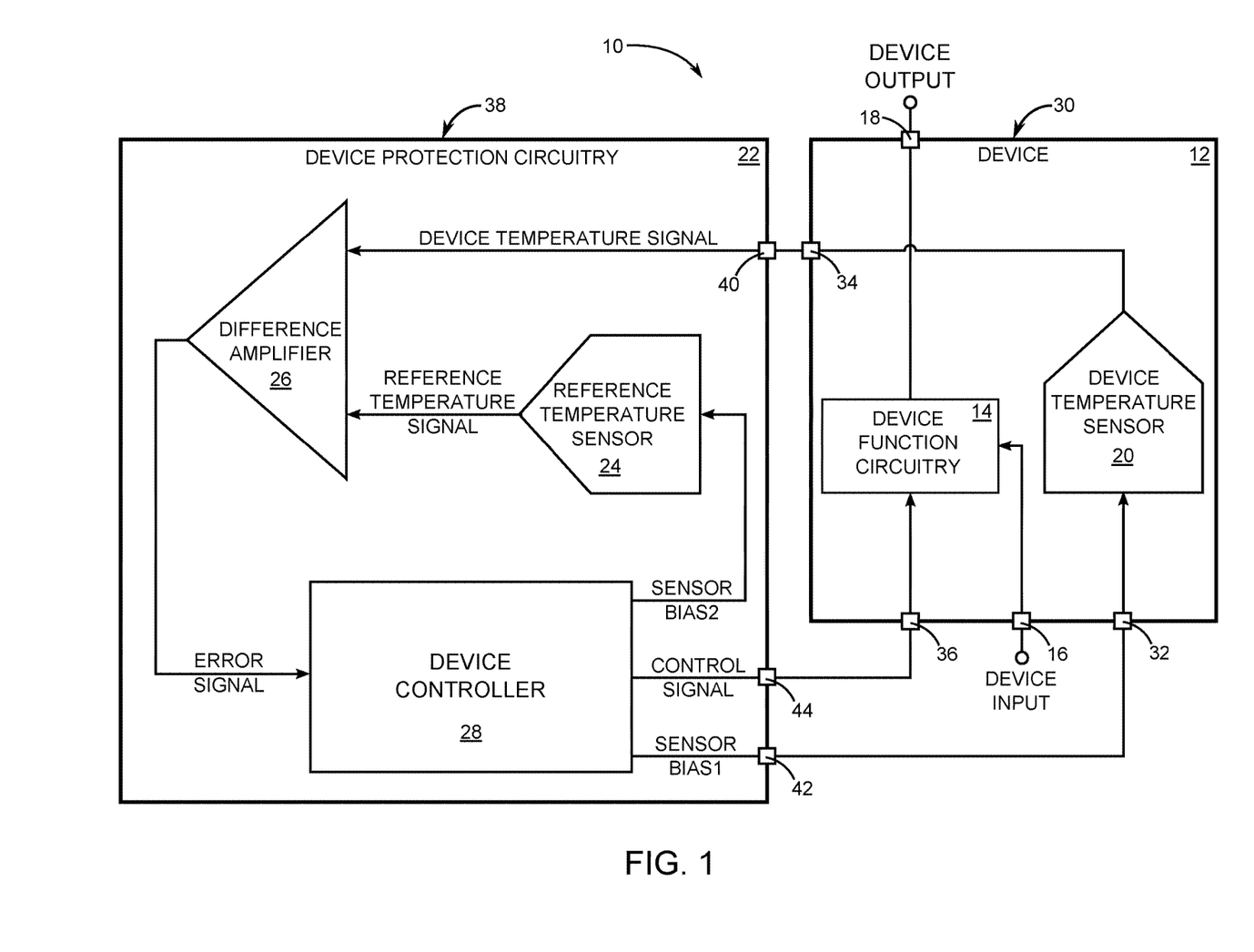
FIG. 1 is a simplified diagram depicting a device and device protection system that are structured in accordance with the present disclosure.

FIG. 1 is a simplified diagram depicting a device protection system 10 that is structured in accordance with the present disclosure. The device protection system 10 includes a device 12 with device function circuitry 14 that is configured to receive a device signal at a device input terminal 16 and output a modified device signal at a device output terminal 18. The device signal and modified device signal depend on the type and purpose of the device 12. For example, if the device 12 is a bipolar junction transistor of an output stage of a radio frequency power amplifier, the device signal is typically a radio frequency carrier to be amplified, and the modified device signal is an amplified version of the radio frequency carrier. In another example, if the device 12 is a thyristor, the device signal is typically an alternating current waveform, and the modified device signal is a triggered portion of the alternating current waveform.

Regardless of the device type, the device 12 includes a device temperature sensor 20 that is integrated with device function circuitry 14 and configured to generate a device temperature signal that is proportional to a temperature of the device function circuitry 14. The device function circuitry 14 is further configured to receive a control signal to maintain power dissipation of the device function circuitry 14 to below a predetermined safe power dissipation level in response to the control signal that is generated based upon the device temperature signal. For the purpose of this disclosure the predetermined safe power dissipation level is defined as a power dissipation level that allows the device function circuitry 14 to modify device signals without permanently thermally damaging the device 12. It is to be understood that the device 12 may have a lower predetermined safe power dissipation level without a heatsink and a higher predetermined safe power dissipation level when equipped with a heatsink. For example, the device 12 may have a higher predetermined safe power dissipation level of 100 watts with a heatsink and may have a lower predetermined safe power dissipation level of 30 watts without a heatsink. The device protection system 10 may be used to protect the device 12 from thermal damage in either case of employing a heatsink or not employing a heatsink.

In one embodiment the device function circuitry 14 is a thyristor and the device signal is an alternating current power signal. Moreover, in this exemplary embodiment, the control signal is a thyristor trigger signal that is either not received or not acted upon when the device temperature signal indicates that the thyristor is dissipating power outside the predetermined power dissipation range.

The device protection system 10 further includes device protection circuitry 22 that receives the device temperature signal and generates the control signal based upon the device temperature signal. In an exemplary embodiment, the device protection circuitry 22 includes a reference temperature sensor 24 configured to generate a reference temperature signal that is different in magnitude from the device temperature signal as the power dissipation of device function circuitry 14 exceeds the predetermined safe power dissipation level. Typically, the reference temperature sensor 24 generates a reference temperature signal that is lower in magnitude than the device temperature signal as the power dissipation of device function circuitry 14 exceeds the predetermined safe power dissipation level. However, it is to be understood that in some embodiments the reference temperature sensor 24 and the device temperature sensor 20 may be configured to generate temperature signals that are inversely proportional to absolute temperature. In such cases, the reference temperature signal is higher in magnitude than the device temperature signal as the power dissipation of device function circuitry 14 exceeds the predetermined safe power dissipation level. In either case, the reference temperature sensor 24 is at a significantly cooler temperature than the device temperature sensor 20 as the power dissipation of device function circuitry 14 exceeds the predetermined safe power dissipation level due to the much closer proximity of the device temperature sensor 20 to the device function circuitry 14.

The device protection circuitry 22 also includes a difference amplifier 26 that is configured to receive the device temperature signal and the reference temperature signal as inputs and amplify a difference between the device temperature signal and reference temperature signal to generate an error signal as an output. Further included in the device protection circuitry 22 is a device controller 28 that is configured to generate the control signal in response to the error signal, wherein the control signal is received by the device function circuitry 14 that is configured to maintain power dissipation of the device to below a predetermined safe power dissipation level in response to the control signal.

In the exemplary embodiment depicted in FIG. 1, the device controller 28 is also configured to generate a device temperature sensor bias signal and transmit the device temperature sensor bias sensor to the device temperature sensor 20. The device temperature sensor bias signal is labeled SENSOR BIAS1 in FIG. 1. The device controller 28 is further configured to generate a reference temperature sensor bias signal and transmit the reference temperature sensor bias signal to the reference temperature sensor 24. The reference temperature sensor bias signal is labeled SENSOR BIAS2 in FIG. 1. In at least one embodiment, the device controller 28 scales the device temperature sensor bias signal and/or the reference temperature bias signal to provide the device temperature sensor 20 with a device sensor bias voltage that is within ±1% of a reference sensor bias voltage provided to the reference temperature sensor 24. In at least one other embodiment, the device controller 28 scales the device temperature sensor bias signal and/or the reference temperature bias signal to provide the device temperature sensor 20 with a device sensor bias current that is within ±1% of a reference sensor bias current provided to the reference temperature sensor 24.

In the exemplary embodiment of FIG. 1, the device function circuitry 14 and the device temperature sensor 20 are integrated together into a first integrated circuit package 30 having a first perimeter depicted in thick solid line. The first integrated circuit package 30 includes the device input terminal 16, the device output terminal 18, a sensor bias input terminal 32, a sensor output terminal 34, and a control signal input terminal 36. As also depicted in FIG. 1, the exemplary embodiment integrates the reference temperature sensor 24, the difference amplifier 26, and the device controller 28 into a second integrated circuit package 38 having a second perimeter depicted in thick solid line. The second integrated circuit package 38 includes a sensor input terminal 40 shown coupled to the sensor output terminal 34 of the first integrated circuit package 30. The second integrated circuit package 38 also includes a sensor bias output terminal 42 that couples to the sensor bias input terminal 32 of the first integrated circuit package 30. The second integrated circuit package 38 further includes a control signal output terminal 44 that couples to the control signal input terminal 36 of the first integrated circuit package 30.

Figure 2A:
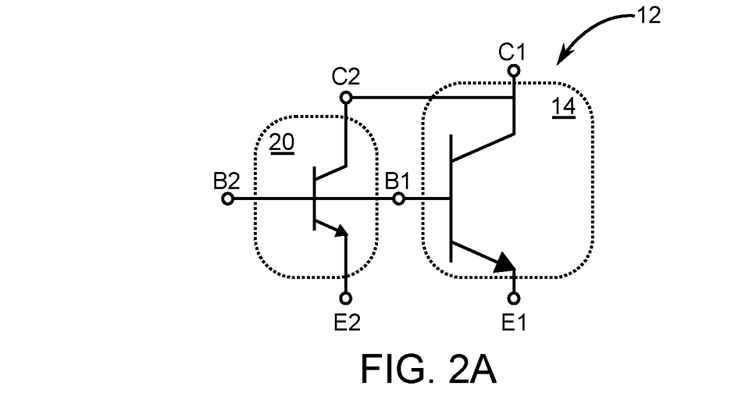
FIG. 2A is a schematic depiction of a first exemplary embodiment of the device that in accordance with the present disclosure is in the form of a radio frequency transistor of the bipolar junction transistor type having the device temperature sensor embedded and integrated with the device function circuitry.

FIG. 2A is a schematic depiction of a first exemplary embodiment of the device 12 that in accordance with the present disclosure is in the form of a radio frequency transistor of the bipolar junction transistor type having the device temperature sensor 20 embedded and integrated with the device function circuitry 14. This type of transistor is typically employed as a main amplification device in a radio frequency power amplifier output stage. In this particular embodiment, the device function circuitry 14 is a bipolar junction transistor having a first collector terminal C1, a first base terminal B1, and a first emitter terminal E1. Either of the first collector terminal C1 or the first emitter terminal E1 is coupled to the device output terminal 18 (FIG. 1) depending upon an output stage configuration, such as a common collector configuration or a common emitter configuration. The first base terminal B1 is typically coupled to the device input terminal 16 shown in FIG. 1. A radio frequency signal to be amplified is typically coupled to the device input terminal 16 by way of a capacitor (not shown). The first base B1 is also typically direct current coupled to the control signal input terminal 36 through which the control signal generated by the device controller 28 (FIG. 1) is transmitted in the form of a bias current. The bias current may be reduced by the device controller 28 to de-energize the device function circuitry 14 based upon the device temperature signal generated by the device temperature sensor 20 when the device temperature signal indicates that power dissipation of the device circuitry 14 exceeds the predetermined safe power dissipation level.

In this particular embodiment, shown in FIG. 2A, a second base terminal B2 of a smaller bipolar junction transistor comprising the device temperature sensor 20 is typically coupled to the sensor bias input terminal 32 (FIG. 1), and a second emitter terminal E2 is coupled to the sensor output terminal 34 (FIG. 1). Moreover, in this particular embodiment, a second collector terminal C2 is coupled to the first collector terminal C1.

Figure 2B:
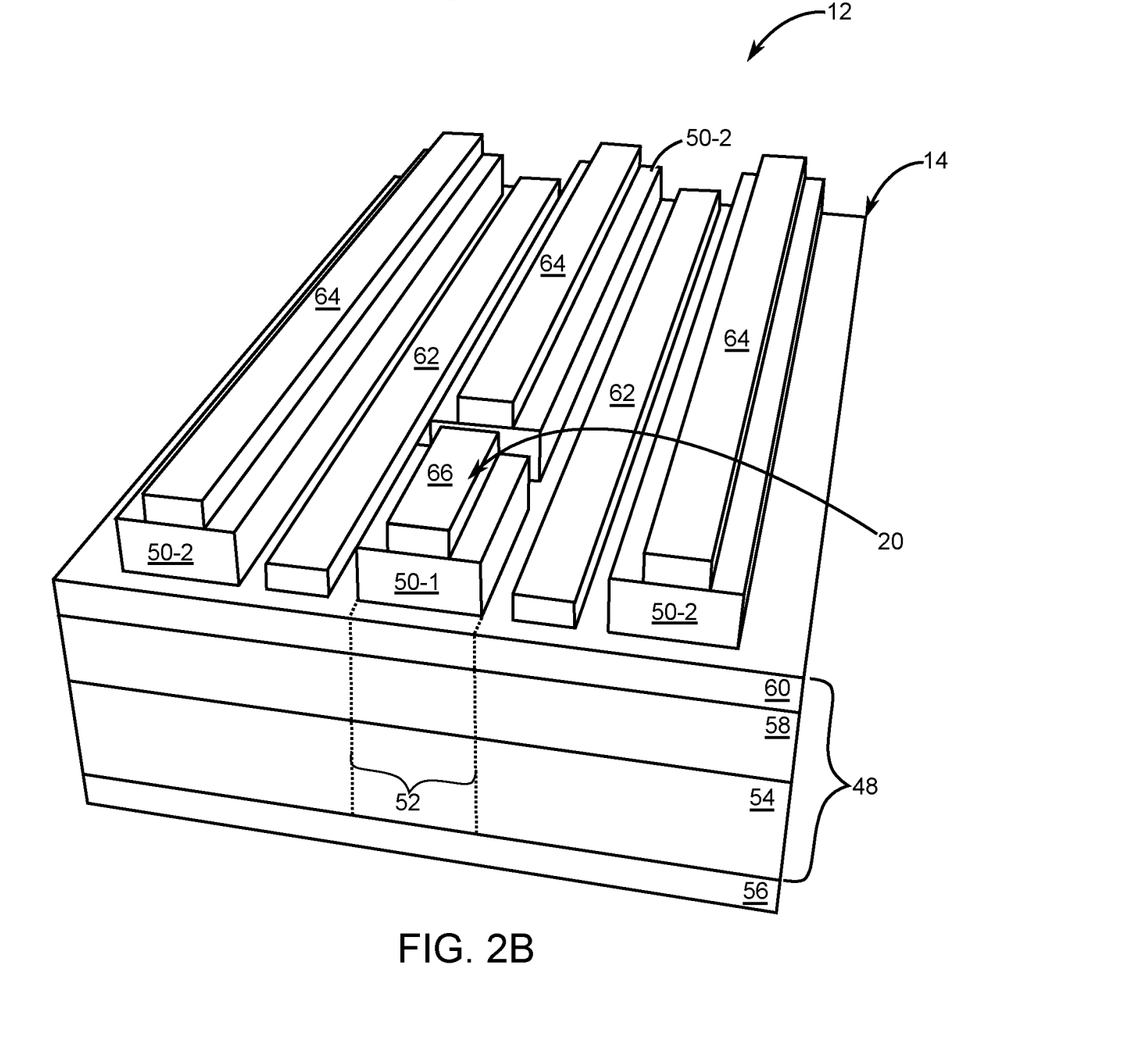
FIG. 2B is a three-dimensional structural view of the first exemplary embodiment of the device of FIG. 2A.

FIG. 2B is a three-dimensional structural view of the first exemplary embodiment of the device 12 of FIG. 2A. In this exemplary case, the device function circuitry 14 is a bipolar junction transistor having a plurality of transistor layers 48 and a plurality of transistor fingers 50 disposed over the plurality of transistor layers 48. At least one of the plurality of transistor fingers 50 is a sensor finger 50-1 that is combined with a portion 52 of the plurality of transistor layers 48 to realize the device temperature sensor 20. While the portion 52 of the plurality of transistor layers 48 is depicted to reside between dashed line boundaries, it is to be understood that electronic influence on the device temperature sensor 20 extends within the plurality of transistor layers 48 beyond the dashed line boundaries depicted in FIG. 2B. Thus, the dashed line boundaries are to be taken as a symbolic representation of the portion 52 of the plurality of transistor layers 48.

In the exemplary embodiment of FIG. 2B, the plurality of transistor fingers 50 includes emitter fingers 50-2. The sensor finger 50-1 may be considered a separated portion of one of the emitter fingers 50-2. However, in other embodiments, the plurality of transistor fingers 50 includes collector fingers, wherein the sensor finger 50-1 may be considered a separated portion of one of the collector fingers. Moreover, in yet other embodiments, wherein the device 12 is a metal oxide semiconductor field-effect transistor, the plurality of transistor fingers 50 includes drain fingers and source fingers, wherein the sensor finger 50-1 may be considered a separated portion of one of the drain fingers or of one of the source fingers. In exemplary embodiments, the separated portion that is the sensor finger 50-1 is longitudinally aligned with one of the plurality of transistor fingers 50 from which the sensor finger 50-1 is separated.

In the particular embodiment depicted in FIG. 2B, the plurality of transistor layers 48 includes an n-type collector layer 54 that is disposed over a collector contact 56, an n⁻-type collector drift region layer 58, and a p-type base layer 60. A plurality of base contacts 62 is disposed over the p-type base layer 60. The plurality of transistor fingers 50 that is made up of emitter-type fingers in this exemplary case are interdigitated with the plurality of base contacts 62. Each of the emitter fingers 50-2 includes an emitter contact 64. The sensor finger 50-1 has a sensor contact 66 that couples to the sensor output terminal 34 depicted in FIG. 1 and is the second emitter E2 in FIG. 2A. In the exemplary embodiment of FIG. 2B, the device function circuitry 14 includes the plurality transistor layers 48, the emitter fingers 50-2, the collector contact 56, the plurality of base contacts 62, and the emitter contacts 64. The device function circuitry 14 does not include the sensor finger 50-1 and the sensor contact 66.

Figure 3A:
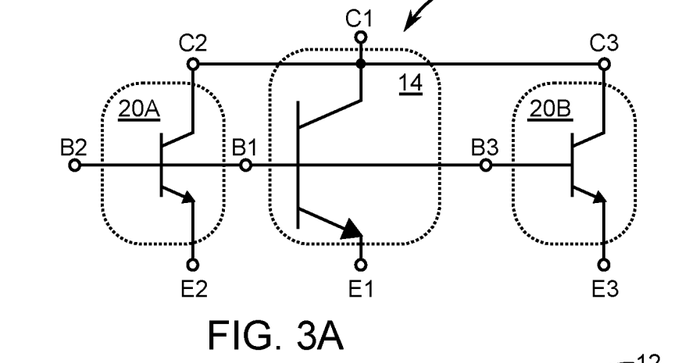
FIG. 3A is a schematic depiction of a second exemplary embodiment of the device that in accordance with the present disclosure is in the form of a radio frequency transistor of the bipolar junction transistor type having at least two embedded integrated temperature sensors that are embedded and integrated with the device function circuitry.

FIG. 3A is a schematic depiction of a second exemplary embodiment of the device 12 that in accordance with the present disclosure is in the form of a radio frequency transistor of the bipolar junction transistor type having at least a first device temperature sensor 20A and a second device temperature sensor 20B that are embedded and integrated with the device function circuitry 14. It is to be understood that additional device temperature sensors that are equivalent in structure to the first device temperature sensor 20A and a second device temperature sensor 20B may be also be integrated with the device function circuitry 14 as needed.

In this particular embodiment, shown in FIG. 3A, a third base terminal B3 of a second smaller bipolar junction transistor comprising the device temperature sensor 20 is typically coupled to the first base terminal B1, the second base terminal B2, and the sensor bias input terminal 32 (FIG. 1). A third emitter terminal E3 is coupled to the sensor output terminal 34 (FIG. 1). Moreover, in this particular embodiment, a third collector terminal C3 is coupled to the first collector terminal C1.

Figure 3B:
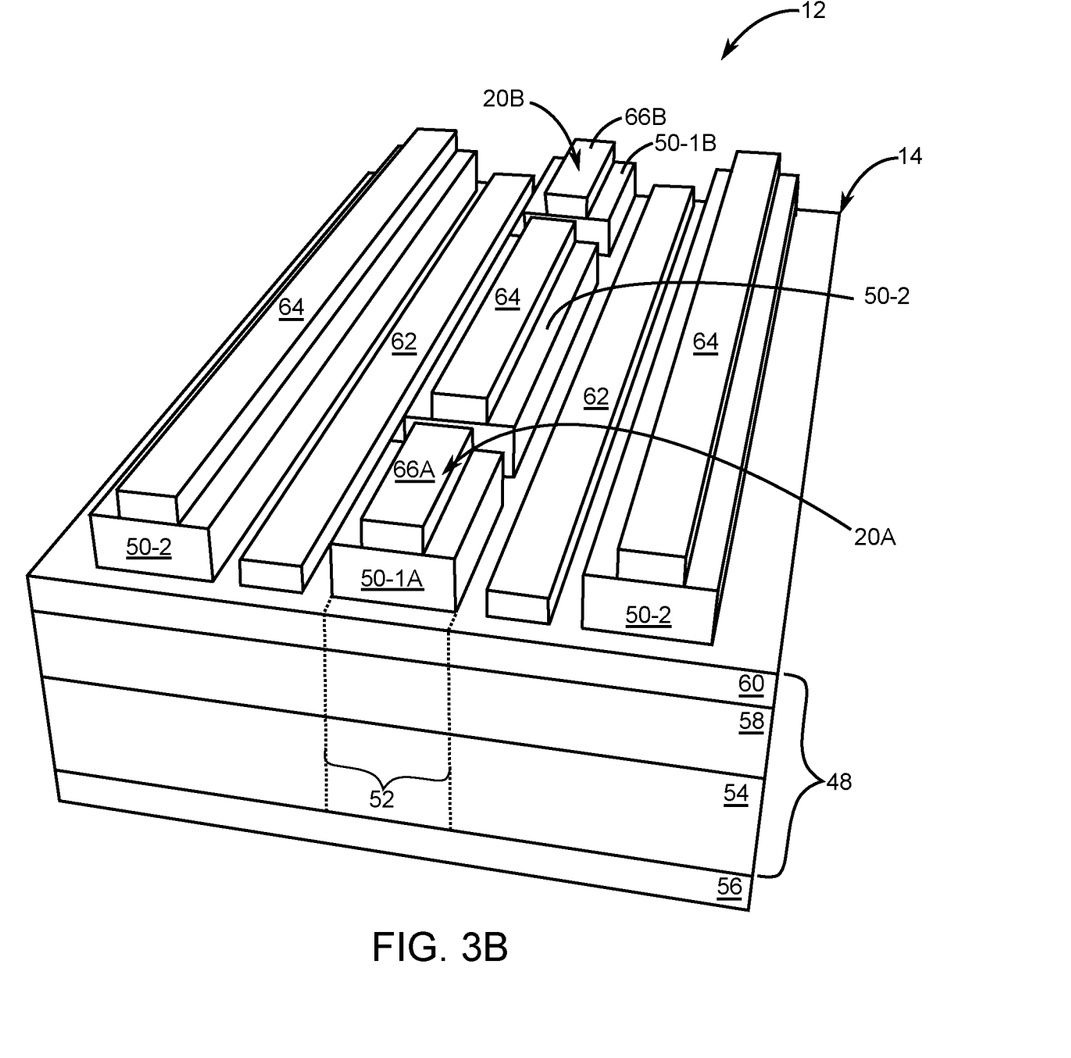
FIG. 3B is a three-dimensional structural view of the second exemplary embodiment of the device of FIG. 3A.

FIG. 3B is a three-dimensional structural view of the second exemplary embodiment of the device 12 of FIG. 3A. In this exemplary embodiment, a first sensor finger 50-1A has a first sensor contact 66A that is the second emitter terminal E2 in FIG. 3A. Moreover, a second sensor finger 50-1B has a second sensor contact 66B that is the third emitter terminal E3 in FIG. 3A. Both the first sensor contact 66A and the second sensor contact 66B couple to the sensor output terminal 34 depicted in FIG. 1. In the exemplary embodiment of FIG. 3B, the device function circuitry 14 includes the transistor layers 48, the emitter fingers 50-2, the collector contact 56, the base contacts 62, and the emitter contacts 64. The device function circuitry 14 does not include the first sensor finger 50-1A, the first sensor contact 66A, the second sensor finger 50-1B, and the second sensor contact 66B.

Figures 4A, 4B:
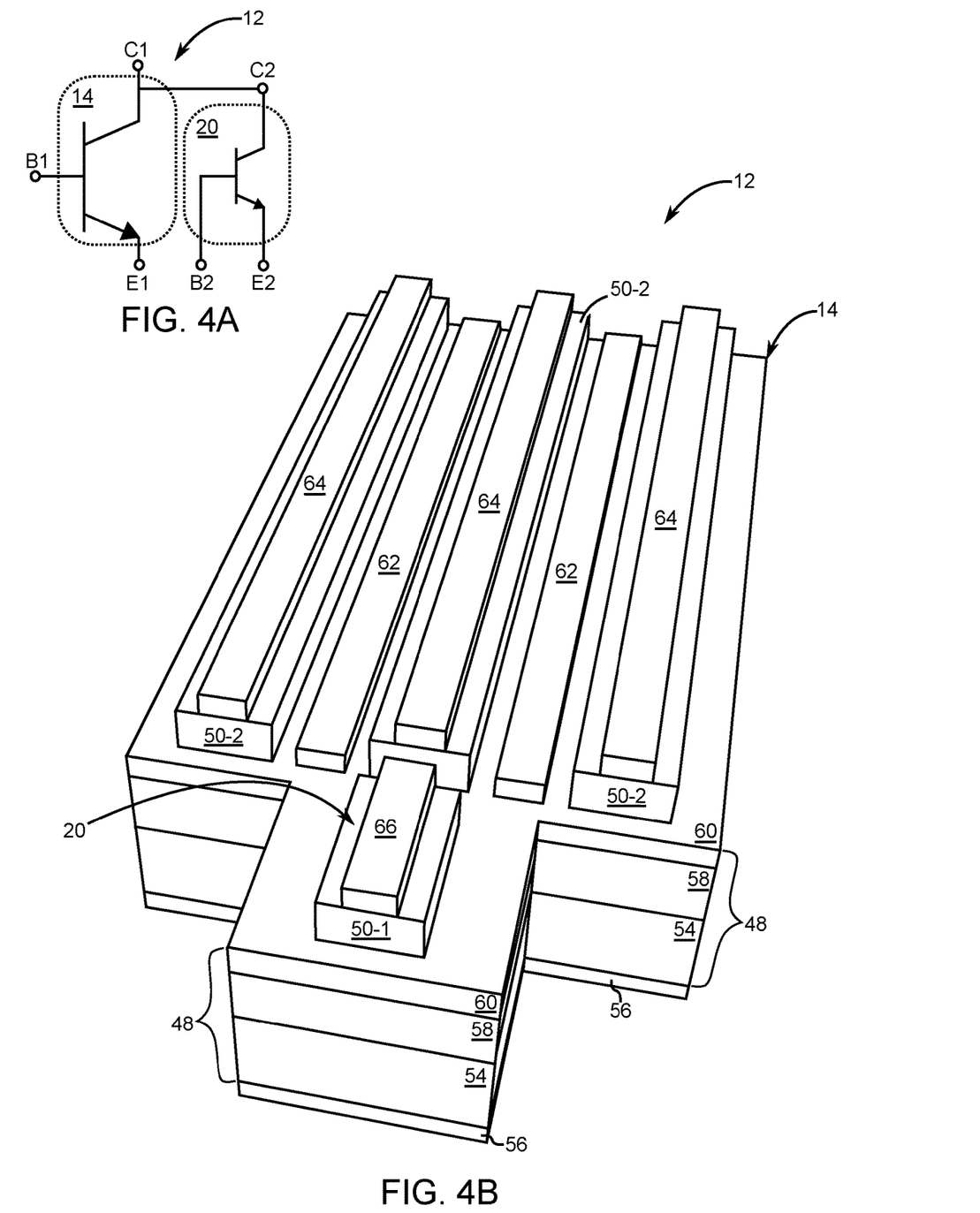
FIG. 4A is a schematic depiction of a third exemplary embodiment of a device that in accordance with the present disclosure includes a device temperature sensor that is side extended from and integrated with device function circuitry, which in this embodiment is in the form of a radio frequency transistor of the bipolar junction transistor type.
FIG. 4B is a three-dimensional structural view of the third exemplary embodiment of the device of FIG. 4A.

FIG. 4A is a schematic depiction of a third exemplary embodiment of the device 12 that in accordance with the present disclosure is in the form of a radio frequency transistor of the bipolar junction transistor type. In this particular embodiment, the device function circuitry 14 is a bipolar junction transistor having a first collector terminal C1, a first base terminal B1, and a first emitter terminal E1. Either of the first collector terminal C1 or the first emitter terminal E1 is coupled to the device output terminal 18 (FIG. 1) depending upon an output stage configuration, such as a common collector configuration or a common emitter configuration. The first base terminal B1 is typically coupled to the device input terminal 16 shown in FIG. 1. A radio frequency signal to be amplified is typically coupled to the device input terminal 16 by way of a capacitor (not shown). The first base B1 is also typically direct current coupled to the control signal input terminal 36 through which the control signal generated by the device controller 28 (FIG. 1) is in the form of a bias current. The bias current to the device controller 28 may be reduced to de-energize the device function circuitry 14 based upon the device temperature signal generated by the device temperature sensor 20.

In this particular embodiment, shown in FIG. 4A, the second base terminal B2 of a smaller bipolar junction transistor comprising the device temperature sensor 20 is typically coupled to the sensor bias input terminal 32 (FIG. 1), and the second emitter terminal E2 is coupled to the sensor output terminal 34 (FIG. 1). However, unlike the second embodiment depicted in FIG. 2A, the first base terminal B1 and the second base terminal B2 do not share a common bias. Like the other embodiments, the second collector terminal C2 is coupled to the first collector terminal C1.

FIG. 4B is a three-dimensional structural view of the third exemplary embodiment of the device 12 of FIG. 4A. In this exemplary embodiment, the device temperature sensor 20 extends from a side of the device function circuitry 14 and is integrated with the device function circuitry 14. As such, the emitter fingers 50-2 can have uniform length. However, for ease of fabrication, the sensor finger 50-1 and the sensor contact 66 remain longitudinally aligned with one of the emitter fingers 50-2.

Figure 5:
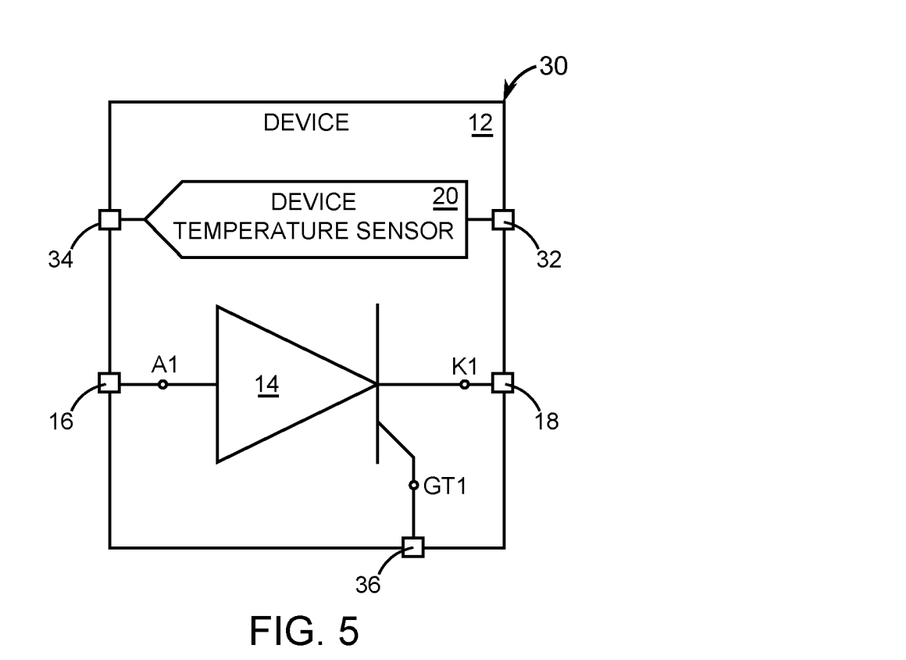
FIG. 5 is a diagram that symbolically depicts device function circuitry as a thyristor in the form of a silicon-controlled rectifier.

FIG. 5 is a diagram that symbolically depicts device function circuitry 14 as a thyristor in the form of a silicon-controlled rectifier. The device temperature sensor 20 is integrated with the device function circuitry 14 to realize device 12 in the first integrated circuit package 30. In this particular embodiment, an anode A1 is coupled to the device input terminal 16 and a cathode K1 is coupled to the device output terminal 18. A gate trigger terminal GT1 is coupled to the control signal input terminal 36. The gate trigger terminal GT1 receives a gate trigger signal to fire the device function circuitry 14 that is in the form of a silicon-controlled rectifier. When fired, a positive portion of an alternating current wave passes from the device input terminal 16 to the device output terminal 18. Other portions of the alternating current waveform are blocked from passing between the device input terminal 16 and the device output terminal 18. The device controller 28 (FIG. 1) generates the control signal that in this case is the gate trigger signal. Thus, when the power dissipation of device function circuitry 14 exceeds the predetermined safe power dissipation level as indicated by the device temperature sensor 20, the device controller stops generating the gate trigger signal to allow the device function circuitry 14 to cool, the device function circuitry 14 in this case being a silicon-controlled rectifier.

Figure 6:
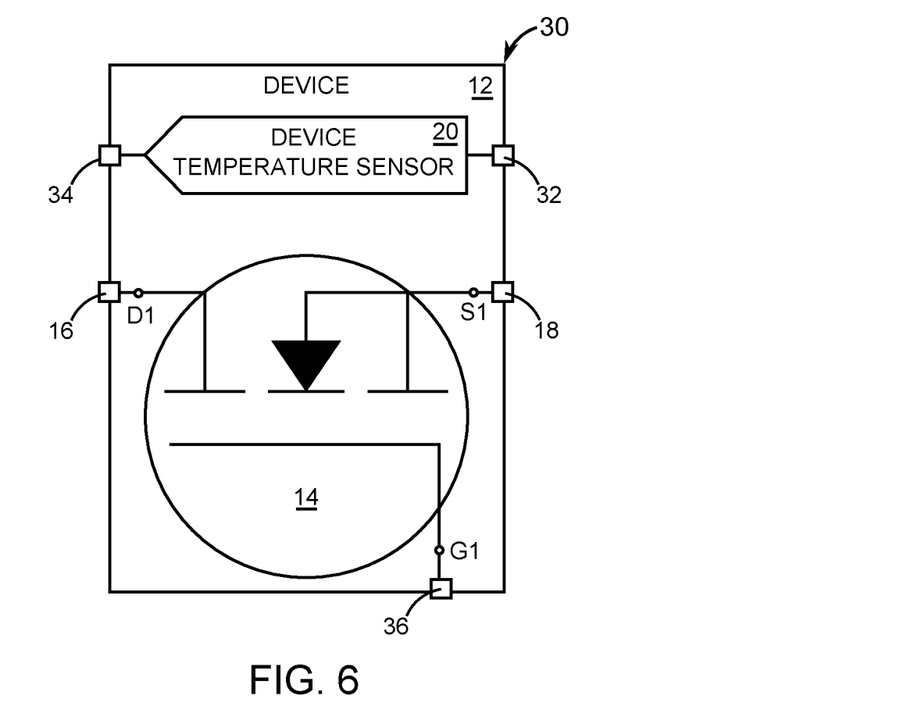
FIG. 6 is a diagram that symbolically depicts device function circuitry in the form of a power metal oxide semiconductor field-effect transistor.

FIG. 6 is a diagram that symbolically depicts device function circuitry 14 in the form of a power metal oxide semiconductor field-effect transistor (MOSFET). The device temperature sensor 20 is integrated with the device function circuitry 14 to realize device 12 in the first integrated circuit package 30. In this particular embodiment, a drain D1 is coupled to the device input terminal 16 and a source S1 is coupled to the device output terminal 18. A gate G1 is coupled to the control signal input terminal 36. The gate G1 receives a gate drive signal in the form of a gate voltage. The device controller 28 (FIG. 1) generates the gate voltage. Thus, when the power dissipation of device function circuitry 14 exceeds the predetermined safe power dissipation level as indicated by the device temperature sensor 20, the device controller 28 reduces, makes negative, or stops generating the gate voltage to allow the device function circuitry 14 to cool, the device function circuitry 14 in this case being a power MOSFET.

Those skilled in the art will recognize improvements and modifications to the preferred embodiments of the present disclosure. All such improvements and modifications are considered within the scope of the concepts disclosed herein and the claims that follow.

What is claimed is:

1. A device comprising:
   device function circuitry configured to receive a device signal and output a modified device signal; and
   a device temperature sensor configured to generate a device temperature signal that is proportional to a temperature of the device function circuitry, wherein the device function circuitry is further configured to maintain power dissipation of the device function circuitry to below a predetermined safe power dissipation level in response to a control signal that is generated based upon the device temperature signal.

2. The device of claim 1 wherein the device function circuitry is configured to receive the control signal from device protection circuitry that is located external of the device.

3. The device of claim 2 wherein the device is configured to transmit the device temperature signal to the device protection circuitry.

4. The device of claim 2 wherein the device is configured to receive a device temperature sensor bias signal from the device protection circuitry.

5. The device of claim 4 wherein the device temperature sensor bias signal provides the device temperature sensor with a first sensor bias voltage that is within ±1% of a second sensor bias voltage provided to a reference temperature sensor comprising the device protection circuitry.

6. The device of claim 4 wherein the device temperature sensor bias signal provides the device temperature sensor with a first sensor bias current that is within ±1% of a second sensor bias current provided to a reference temperature sensor comprising the device protection circuitry.

7. The device of claim 1 wherein the device function circuitry is a radio frequency transistor comprising:
 a plurality of transistor layers; and
 a plurality of transistor fingers disposed over the plurality of transistor layers, wherein at least one of the plurality of transistor fingers is a sensor finger comprising the device temperature sensor.

8. The device of claim 7 wherein one transistor finger of the plurality of transistor fingers is separated from and longitudinally aligned with the sensor finger.

9. The device of claim 8 wherein the one transistor finger of the plurality of transistor fingers that is longitudinally aligned with the sensor finger is an emitter finger.

10. The device of claim 1 wherein the device function circuitry is a thyristor and the device signal is an alternating current power signal and the control signal is a thyristor trigger signal that is not received when the device temperature signal indicates that the thyristor is dissipating power outside the predetermined power dissipation range.

11. A device protection system comprising:
 device function circuitry configured to receive a device signal and output a modified device signal; and
 a device temperature sensor configured to generate a device temperature signal that is proportional to a temperature of the device function circuitry, wherein the device function circuitry is further configured to maintain power dissipation of the device function circuitry to below a predetermined safe power dissipation level in response to a control signal that is generated based upon the device temperature signal;
 device protection circuitry comprising:
  a reference temperature sensor configured to generate a reference temperature signal that is different in magnitude from the device temperature signal as the power dissipation of device function circuitry exceeds the predetermined safe power dissipation level;
  a difference amplifier configured to amplify a difference between the device temperature signal and reference temperature signal to generate an error signal; and
  a device controller configured to generate the control signal received by the device function circuitry based upon the magnitude of the error signal.

12. The device protection system of claim 11 wherein the device controller is further configured to generate a device sensor bias signal that biases the device temperature sensor and a reference sensor bias signal that biases the reference temperature sensor.

13. The device protection system of claim 12 wherein the device sensor bias signal provides the device temperature sensor with a first sensor bias voltage that is within ±1% of a second sensor bias voltage provided to the reference temperature sensor.

14. The device protection system of claim 12 wherein the device temperature sensor bias signal provides the device temperature sensor with a first sensor bias current that is within ±1% of a second sensor bias current provided to a reference temperature sensor comprising the device protection circuitry.

15. The device protection system of claim 11 wherein the device function circuitry is a transistor comprising:
 a plurality of transistor layers; and
 a plurality of transistor fingers disposed over the plurality of transistor layers, wherein at least one of the plurality of transistor fingers is a sensor finger comprising the device temperature sensor.

16. The device protection system of claim 15 wherein one transistor finger of the plurality of transistor fingers is separated from and longitudinally aligned with the sensor finger.

17. The device protection system of claim 16 wherein the one transistor finger of the plurality of transistor fingers that is longitudinally aligned with the sensor finger is an emitter finger.

18. The device protection system of claim 11 wherein the device function circuitry is a thyristor, the device signal is an alternating current power signal, and the control signal is a thyristor trigger signal that is not received when the device temperature signal indicates that the thyristor is dissipating power outside the predetermined power dissipation range.

19. Device protection circuitry comprising:
 a reference temperature sensor configured to generate a reference temperature signal that is different in magnitude from a device temperature signal generated by a device temperature sensor as power dissipation of a device exceeds a predetermined safe power dissipation level;
 a difference amplifier configured to amplify a difference between the device temperature signal and the reference temperature signal to generate an error signal; and
 a device controller configured to generate a control signal in response to the error signal, wherein the control signal is received by device function circuitry that is configured to both modify a device signal and maintain the power dissipation of the device to below the predetermined safe power dissipation level in response to the control signal.

20. The device protection circuitry of claim 19 wherein the device controller is further configured to generate a device sensor bias signal that biases the device temperature sensor and a reference sensor bias signal that biases the reference temperature sensor.

* * * * *